(12) United States Patent
Botma (10) Patent No.: US 7,326,948 B2
(45) Date of Patent: Feb. 5, 2008

(54) BEAM MODIFYING DEVICE, LITHOGRAPHIC PROJECTION APPARATUS, METHOD OF TREATING A BEAM, AND DEVICE MANUFACTURING METHOD

(75) Inventor: Hako Botma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 46 days.

(21) Appl. No.: 11/203,413

(22) Filed: Aug. 15, 2005

(65) Prior Publication Data

US 2007/0090278 A1   Apr. 26, 2007

(51) Int. Cl.
*H01S 3/13* (2006.01)

(52) U.S. Cl. .............. 250/578.1; 250/216; 372/25; 372/30

(58) Field of Classification Search ........... 372/25, 372/30, 700; 250/227.12, 578.1; 398/161; *H01S 3/10, H01S 3/13*
See application file for complete search history.

(56) References Cited

U.S. PATENT DOCUMENTS

| | | | |
|---|---|---|---|
| 6,389,045 B1 * | 5/2002 | Mann et al. ........ | 372/25 |
| 6,535,531 B1 * | 3/2003 | Smith et al. ........ | 372/25 |
| 6,549,267 B1 * | 4/2003 | Kudo ............ | 355/53 |
| 6,693,930 B1 * | 2/2004 | Chuang et al. ..... | 372/29.021 |
| 6,762,821 B2 * | 7/2004 | Kamono ........... | 355/30 |
| 6,996,141 B1 * | 2/2006 | Schuster et al. ..... | 372/30 |
| 7,035,012 B2 * | 4/2006 | Govorkov et al. ... | 359/618 |
| 2004/0136417 A1 * | 7/2004 | Webb et al. ........ | 372/25 |
| 2005/0105579 A1 * | 5/2005 | Smith et al. ........ | 372/55 |
| 2006/0216037 A1 * | 9/2006 | Wiessner et al. .... | 398/161 |

* cited by examiner

*Primary Examiner*—Georgia Epps
*Assistant Examiner*—Christopher M Yealy
(74) *Attorney, Agent, or Firm*—Pillsbury Winthrop Shaw Pittman LLP

(57) ABSTRACT

A beam modifying device configured to receive an input radiation beam along a first optical axis, and configured to emit an output radiation beam along a second optical axis. The beam modifying device includes a divider disposed along the first optical axis and configured to divide the incoming radiation beam into a first part and a second part, the divider being configured to direct the first part along the second optical axis and to direct the second part via a delay path. The beam modifying device further includes optics forming the delay path, the optics being configured to receive the second part and to direct the second part via the delay path and then along the second optical axis. The optics are arranged to mirror the second part such that the second part is mirrored with respect to the first part.

25 Claims, 9 Drawing Sheets

PRIOR ART

BEAM MODIFYING DEVICE, LITHOGRAPHIC PROJECTION APPARATUS, METHOD OF TREATING A BEAM, AND DEVICE MANUFACTURING METHOD

BACKGROUND OF THE INVENTION

1. Field of the Invention

The present invention relates to a beam modifying device, a lithographic projection apparatus, a method of treating a beam and a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

As will be explained in more detail below, a lithographic apparatus generates a patterned beam to apply a desired pattern on a substrate. A radiation system is provided, including a source, an illuminator, and a beam delivery system (if required), to generate a beam. In order to get optimal results, the beam should be well defined, having constant and predictable properties. The beam should be symmetrical, i.e. in shape, intensity distribution and angular distribution.

However, in practice, no perfectly symmetrical and/or uniform radiation beams are obtainable. For instance, the Cymer XLA-165 laser, is known to produce a beam having a constant contour (due to a rectangular diaphragm inside the laser), but having a fluctuating and asymmetric intensity distribution of the beam cross-section. This results in unstable measurements of beam positioning and pointing. It is known that high-power lasers in general do not have a constant and symmetric intensity profile: the profile changes in time, e.g. due to laser refills or gas heating or gas burn-up.

In many cases the beam must be kept constant in position to below 0.5 mm and in pointing to below 30 μrad at the illuminator entrance so that the imaging results are not negatively impacted.

SUMMARY OF THE INVENTION

It is desirable to provide a beam modifying device that reduces the asymmetric properties of a radiation beam. According to an aspect of the invention, there is provided a beam modifying device configured to receive an input radiation beam along a first optical axis, and configured to emit an output radiation beam along a second optical axis, the beam modifying device including a divider disposed along the first optical axis and configured to divide the incoming radiation beam into a first part and a second part, the divider being configured to direct the first part along the second optical axis and to direct the second part via a delay path; and optics forming the delay path, the optics being configured to receive the second part and to direct the second part via the delay path and then along the second optical axis, wherein the optics are arranged to mirror the second part such that the second part is mirrored with respect to the first part. The first and second part may be in line with respect to each other.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
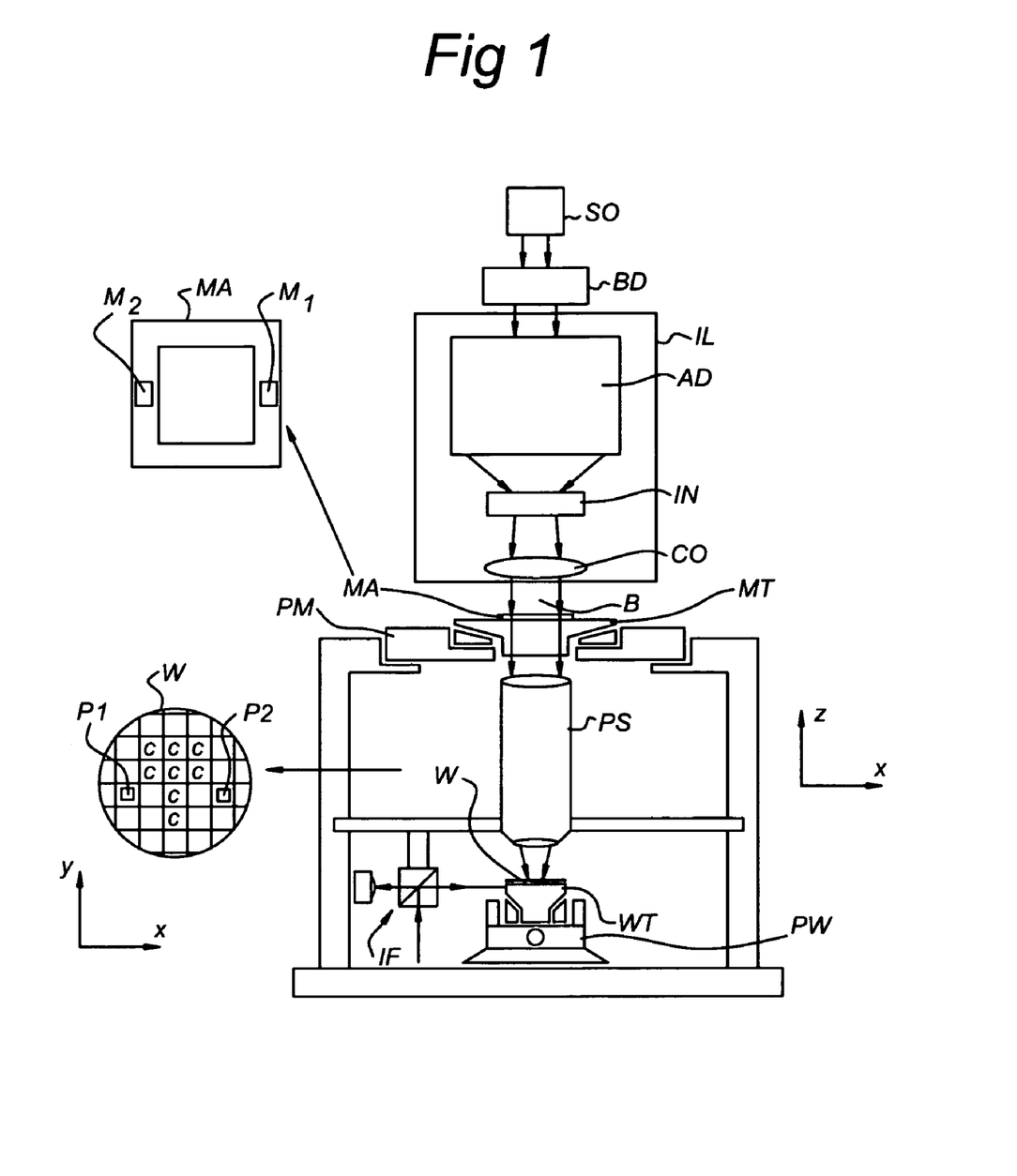
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus include large expensive lens elements that are difficult to fabricate. Typically, an excimer laser is used to supply the lithographic apparatus with radiation in the form of pulses. The expensive lens elements are subject to degradation resulting from billions of these high intensity ultraviolet pulses. Optical damage is known to increase with increasing intensity (i.e., light power (energy/time) per $cm^2$ or $mJ/ns/cm^2$) of the pulses from the laser. The typical pulse length from these lasers is about 20 ns, so a 5 mJ laser pulse would have a pulse power intensity of about 0.25 mJ/ns (0.25 MW). Increasing the pulse energy to 10 mJ without changing the pulse duration would result in a doubling of the power of the pulses to about 0.5 mJ/ns that could significantly shorten the usable lifetime of the lens elements.

A pulse stretching configuration has been proposed in U.S. Patent Application Publication 2004/0136417 A1 for use with a lithographic apparatus. In this application, the problem of optical damage is avoided by increasing substantially the pulse length from about 20 ns to more than 50 ns providing a reduction in the rate of optics degradation.

Figure 2:
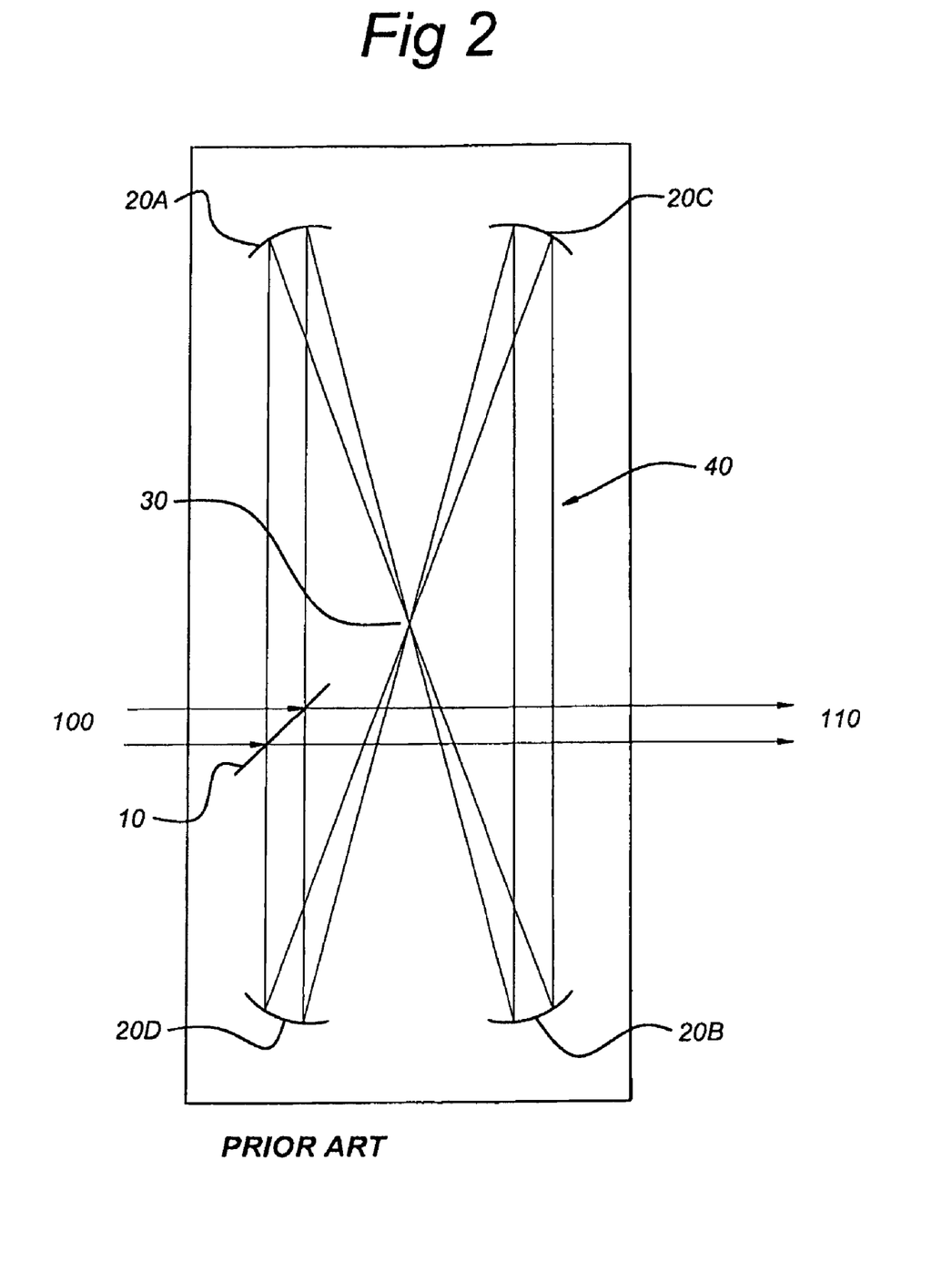
FIG. 2 schematically depicts a pulse stretching unit according to the state of the art.

The pulse stretching unit from U.S. Patent Application Publication 2004/0136417 A1 is shown in FIG. 2: a 60R/40T (60% reflected, 40% transmitted) beam splitter 10 reflects about 60 percent of the incoming radiation beam 100 into a delay path 40 formed by four focusing mirrors 20A, 20B, 20C and 20D. The 40 percent transmitted portion of each pulse of beam 100 becomes a first sub-pulse of a corresponding stretched pulse in the outgoing beam 110. The reflected beam is directed by beam splitter 10 to mirror 20A which focuses the reflected portion to point 30. The beam then expands and is reflected from mirror 20B which converts the expanding beam into a parallel beam and directs it to mirror 20C which focuses the beam again at point 30. This beam is then reflected by mirror 20D which like the 20B mirror changes the expanding beam to a light parallel beam and directs it back to beam splitter 10 where 60 percent of the first reflected light is reflected perfectly in line with the first transmitted portion of this pulse in outgoing beam 110 to become a second sub-pulse. 40 percent of the first reflected beam is transmitted by beam splitter 10 and follows exactly the path of the first reflected beam produces additional smaller sub-pulses in the outgoing radiation beam 110. By configuring the reflection coefficients and the path lengths, the resulting outgoing pulse is stretched from about 20 ns to about 50 ns.

Another pulse stretching unit has been proposed by U.S. Application 60/629,310, filed Nov. $19^{th}$, 2004 by the applicant. In this document, several types of pulse stretching units are described.

The common principle of the above mentioned pulse stretching units is to split an incoming radiation beam into different radiation beam parts, using a beam splitter. One beam part is directed to the exit of the pulse stretching unit, while the other beam part is guided back to the beam splitter, via a delay path. When the other beam part hits the beam splitter for the second time, it is split into a further beam parts. One of these further beam parts is directed to the exit of the pulse stretching unit, following the path of the beam part that was directed to the exit earlier. The other further beam part is guided back to the beam splitter, via the delay path. When it hits the splitter for the third time it is split again, etc. By this, a single incoming pulse is transferred into a sequence of subsequent pulses, having a decaying intensity.

According to the invention, a beam modifying device BMD is proposed, that improves the quality of the radiation beam, i.e. it evens out the asymmetrical features of the radiation beam, such as uneven energy and angular distributions and irregularities of the shape of the contour. Note that the beam modifying devices as discussed below are not solely suitable for use in combination with pulsed radiation beams, but may also be used to improve the beam quality of continuous beams.

Figure 3:
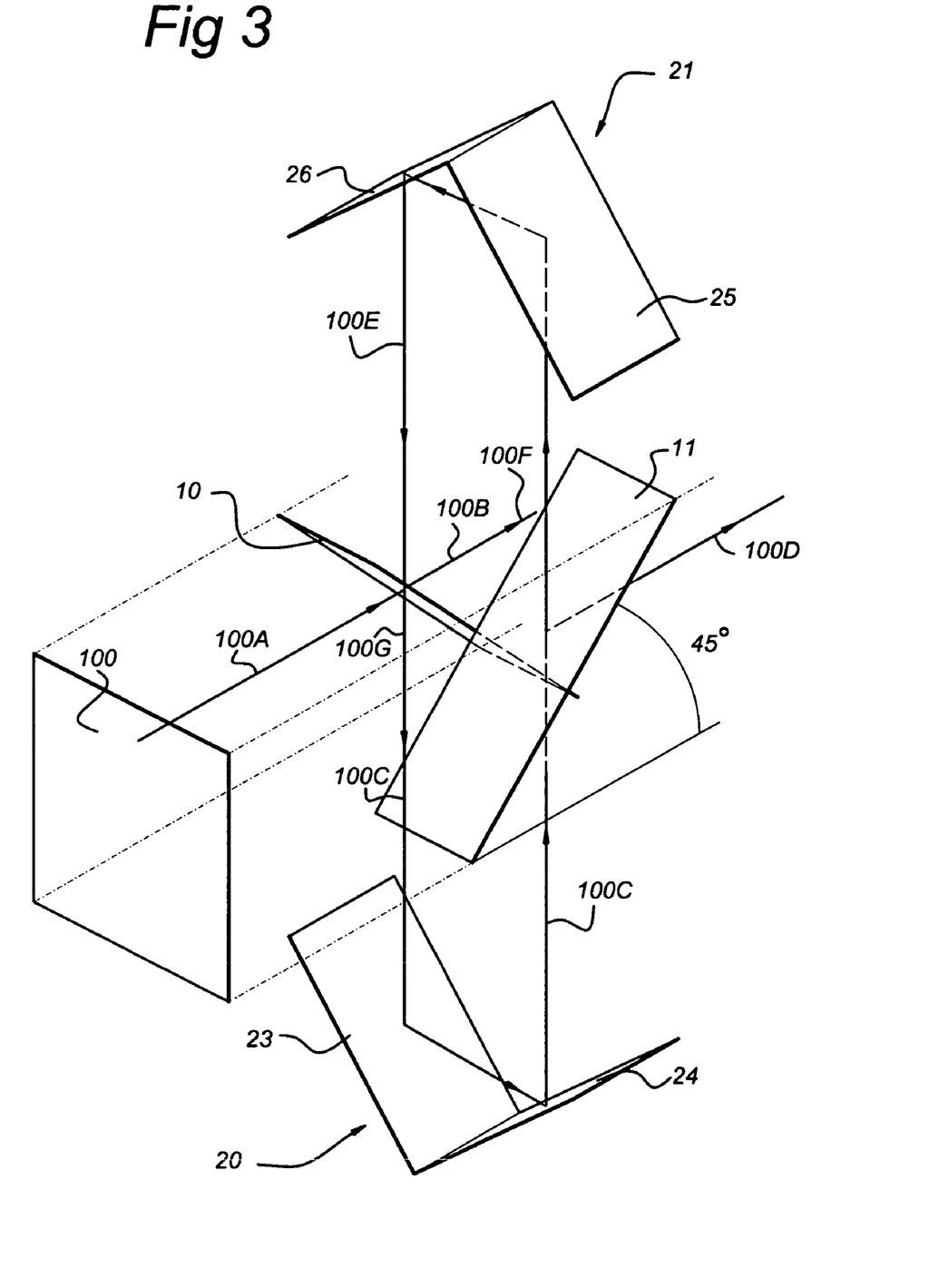
FIG. 3 schematically depicts a beam modifying device according to an embodiment of the invention.

According to a first embodiment, schematically depicted in FIG. 3, a beam modifying device BMD is provided, including a first and second splitter 10, 11. The first and second splitter 10, 11 may both be formed by semi transparent mirrors. The first and second beam splitter 10, 11 are both disposed in the optical axis of an incoming radiation beam 100. The first splitter 10 is positioned under an angle of +45° and the second beam splitter 11 under an angle of −45°, both with respect to an axis of rotation being perpendicular to the optical axis as defined by the propagation direction of the incoming radiation beam 100, as can be seen in FIG. 3.

The first and second splitter 10, 11 are positioned such, that half of the incoming radiation beam 100 hits the first splitter 10 (left part in FIG. 3) and the other half of the incoming radiation beam 100 hits the second splitter 11 (right part in FIG. 3).

By way of example, a path of a part 100A of the incoming radiation beam 100 is indicated in FIG. 3. As can be clearly seen in FIG. 3, part 100A, being in the left part of the incoming radiation beam 100, hits the first splitter 10. The beam 100A is split in a part 100B and a part 100C. Part 100B travels straight through the first splitter 10 and exits the beam modifying device BMD in the direction of the optical axis. Part 100C is reflected downwards to a first corner cube 20. The first corner cube 20 includes a first and a second reflective surface 23, 24. First and second reflective surfaces 23, 24 are under a relative angle of 90° with respect to each other, such that part 100C is reflected back upwards. The first corner cube 20 is positioned such, that the direction of part 100C in between the first and second reflective surfaces 23, 24 is substantially perpendicular with respect to the optical axis and the downward part 100C. As a result of this, the upwardly reflected part 100C is parallel with respect to the downward part 100C, but is shifted to the right according to FIG. 3. As a result of this, the upwardly reflected part 100C hits the second splitter 11 in its way up, instead of the first splitter 10.

This part 100C is then split by the second splitter 11 into a part 100D and 100E. Part 100D is reflected by the second splitter 11 towards the exit of the beam modifying device BMD in the direction of the optical axis. It is noted here that part 100D does not coincide with part 100A, but is parallel with part 100A and shifted to the right with respect to part 100A.

Part 100E travels upwardly and hits a second corner cube 21, including a third and fourth reflective surface 25, 26, similar to the first corner cube 20. The second corner cube 21 has a similar orientation with respect to the second splitter 11 as the first corner cube 20 has with respect to the first splitter 10. Therefore, it will be understood that the part 100E is reflected by the corner cube 21 in such a way that it hits the first splitter 10.

Next, the part 100E is split into a part 100F and a part 100G (not shown in FIG. 3). Part 100F is reflected towards the exit of the beam modifying device BMD and coincides with the part 100B. Part 100G travels straight downwards and follows the path of part 100C.

Only half of the incoming radiation beam 100 hits the first splitter 10. The other half hits the second splitter 11. It will be understood that a similar explanation can be given for the part of the incoming radiation beam 100 that hits the second splitter. This part is split by the second splitter 11 into a part travelling directly through the second splitter 11 and part reflected upwardly by the second splitter 11 via the second corner cube 21 to the first splitter 10. The first splitter then splits this part into further parts, etc.

The first and second splitters 10, 11 may for instance be 50% splitters, i.e. 50% of an incoming radiation beam 100 is reflected and 50% of an incoming radiation beam passes. It will readily be understood by a skilled person that, in that case, 50% of the incoming radiation beam 100 directly passes the first and second splitters 10, 11, forming the first pulse of the sequence of subsequent pulses generated by the beam modifying device BMD as described above. 25% of the incoming radiation beam 100 exits the beam modifying device BMD forming the second pulse of the sequence of subsequent pulses generated by the beam modifying device BMD. The third pulse is formed by 12.5% of the incoming radiation beam, etc.

Figure 4A:
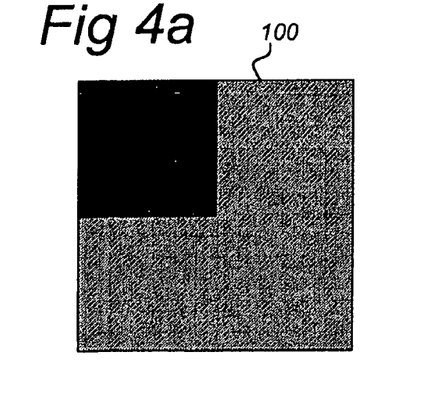
FIGS. 4a, 4b, 4c, 4d, 4e and 4f schematically depict intensity distributions of different radiation beams in the beam modifying device according to the first embodiment.
Figure 4B:
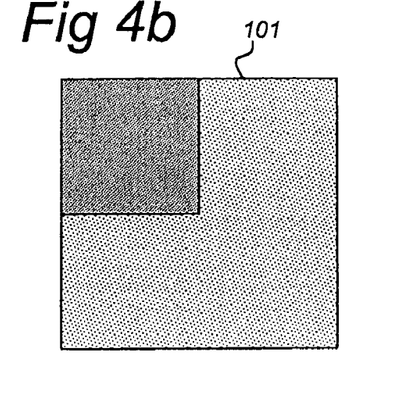

The effect of the beam modifying device BMD as explained above will now be discussed in more detail referring to FIG. 4a-4f. FIG. 4a shows a cross-section of an incoming radiation beam 100, having a rectangular shape. The intensity distribution over the cross section is not uniform, but, by way of example, a higher intensity is present in the left upper corner. FIG. 4b shows a first pulse 101 as generated by the beam modifying device BMD, having an intensity of 50% with respect to the incoming radiation beam 100, and has a similar shape and a similar (uneven) energy distribution. The first pulse 101 includes part 100B as described above.

Figure 4C:
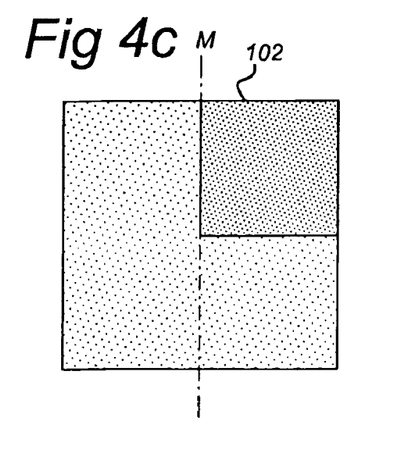

A second pulse 102 is outputted by the beam modifying device BMD and is shown in FIG. 4c. The second pulse 102 includes part 100D as describe above. This second pulse 102 has an intensity that is one quarter of the intensity of the incoming radiation beam 100 and also has a similar rectangular shape compared to the incoming radiation beam 100. However, the energy distribution is mirrored over line M (indicated in FIG. 4c). This mirroring is a direct result of the configuration of the beam modifying device BMD as explained above with reference to FIG. 3. In the delay path, formed by the first and second corner cubes 20, 21, left and right are switched.

Figure 4D:
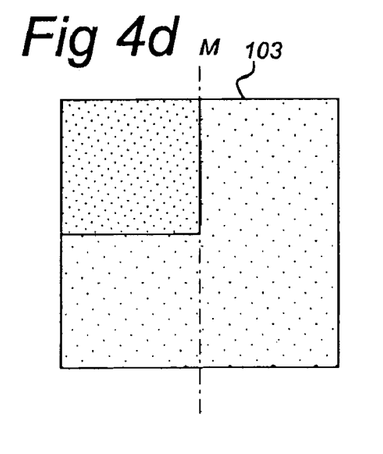

The third pulse 103 shown in FIG. 4d includes part 100F. It has a similar rectangular shape, has an intensity that is half the intensity of the second pulse, and is mirrored over line M with respect to the second pulse. It will be understood that each subsequent pulse is mirrored over line M with respect to the previous pulse and has half the intensity of the previous pulse.

Figure 4E:
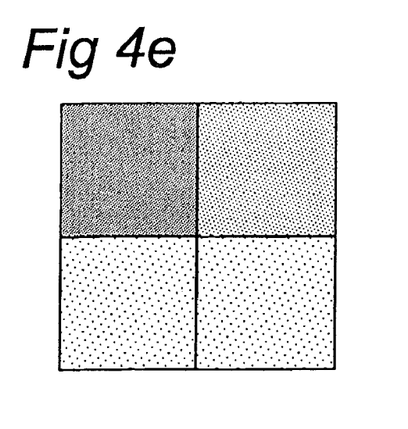

FIG. 4e finally shows the sum of all the subsequent pulses generated by the beam modifying device BMD. It is shown that the upper left corner has an intensity that is lower than the intensity of the upper left corner of the incoming radiation beam 100, depicted in FIG. 4a. The upper right corner has an intensity that is higher than the upper right corner of the incoming radiation beam 100. The lower part of the sum has an intensity that substantially equals the intensity of the lower part of the incoming radiation beam 100.

As a result of the mirroring explained above, the sum of the generated pulses shown in FIG. 4e is symmetrical to a greater extend than the incoming radiation beam 100. According to the explanation above, the intensity distribution is smeared out, but it will be understood that also differences in the angular distribution (divergence of the radiation beam) and irregularities in the cross sectional shape of the radiation beam are also smeared out.

The left and right parts of the incoming radiation beam 100 are mixed, so the left and right variations (intensity, divergence, shape) are smeared out.

The beam modifying device BMD may be provided with a tilting device arranged to rotate the beam modifying device BMD about the optical axis. The effect of such a rotation, is that the mirror line M, as shown in FIG. 4c, is rotated (clockwise or counter clockwise) in the drawing surface around the centre of the square (note, the optical axis is perpendicular to the drawing surface in FIG. 4c).

So, when a rotation of 90° with respect to the situation depicted in FIG. 4a-4e is applied, the beam modifying device BMD is positioned to mix the upper and lower part of the incoming radiation beam. However, any other suitable rotation can be applied. Of course, it should be noted, that in case a rotation is applied, other than 0°, 90°, 180° or 270°, the size of the first and second splitters 10, 11 should be chosen such, that still the entire radiation beam 100 can be split.

Figure 4F:
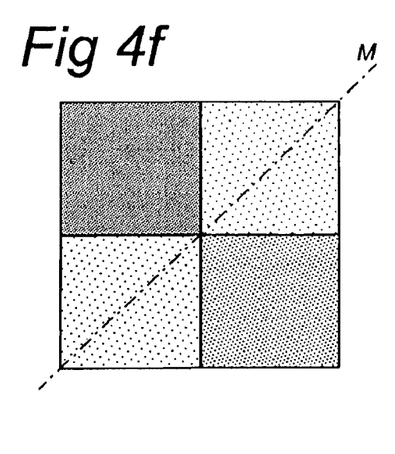

FIG. 4f depicts an example in which the beam modifying device BMD is rotated about 45°, so the upper left and lower right parts are mixed.

It will be understood that the terms left, right, upper and lower as used in the above explanation only refer to the orientation in which the beam modifying device BMD is shown in the figures. In practice, the beam modifying device BMD may have a different orientation, depending on the orientation of the optical axis.

In an ideal situation, the incoming radiation beam 100 is a perfectly collimated beam, i.e. has a divergence equal to zero. In practice, the incoming radiation beam 100 is not a perfectly collimated beam and has a divergence. It is observed that a small divergence of the incoming radiation 100 (e.g. 2 mrad) may result in a blurred outputted radiation beam. Each time the radiation beam passes through the beam modifying device BMD, the contour of the radiation beam becomes more blurred.

Figure 5A:
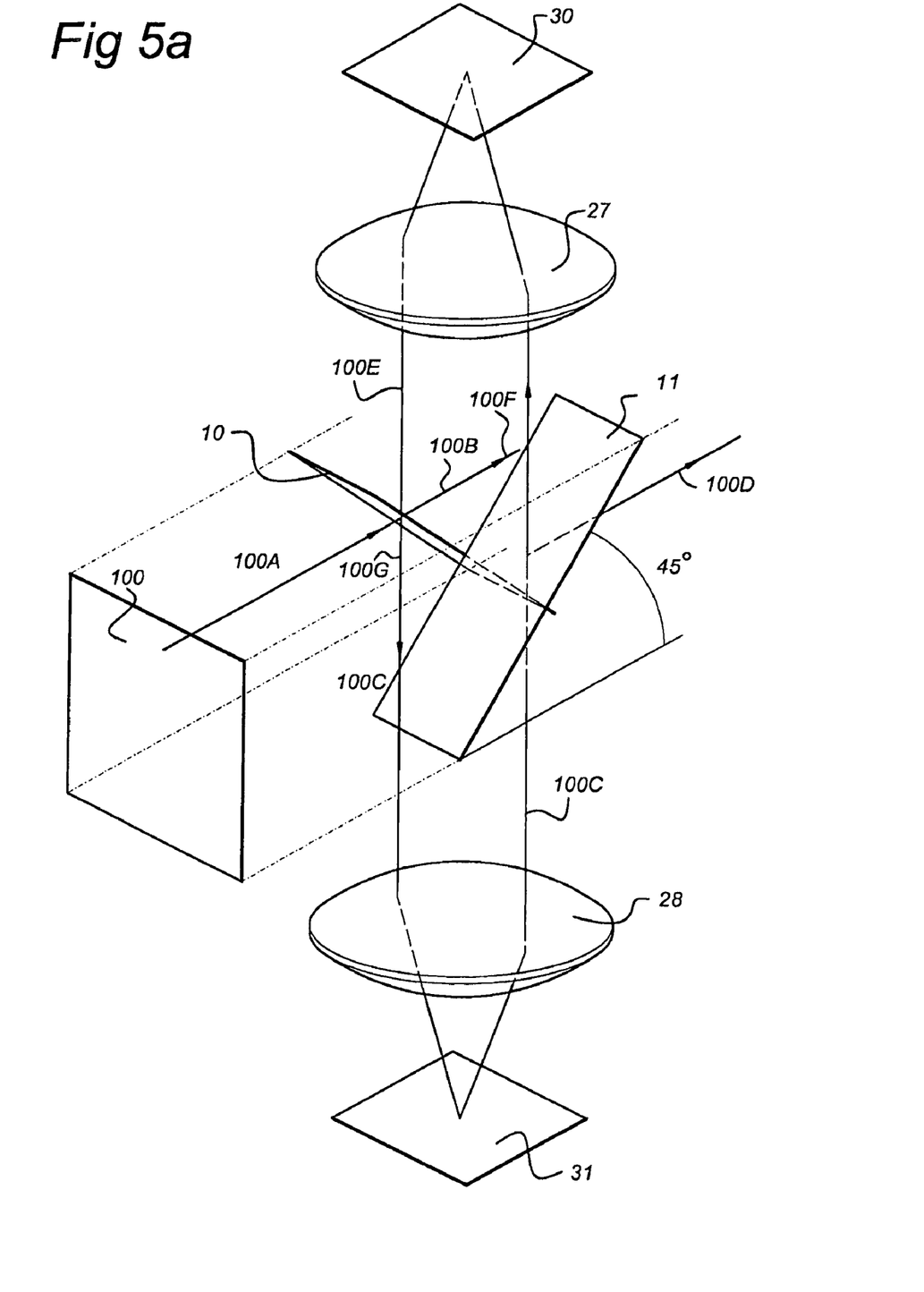
FIGS. 5a and 5b schematically depict an alternative beam modifying device according to the invention.
Figure 5B:
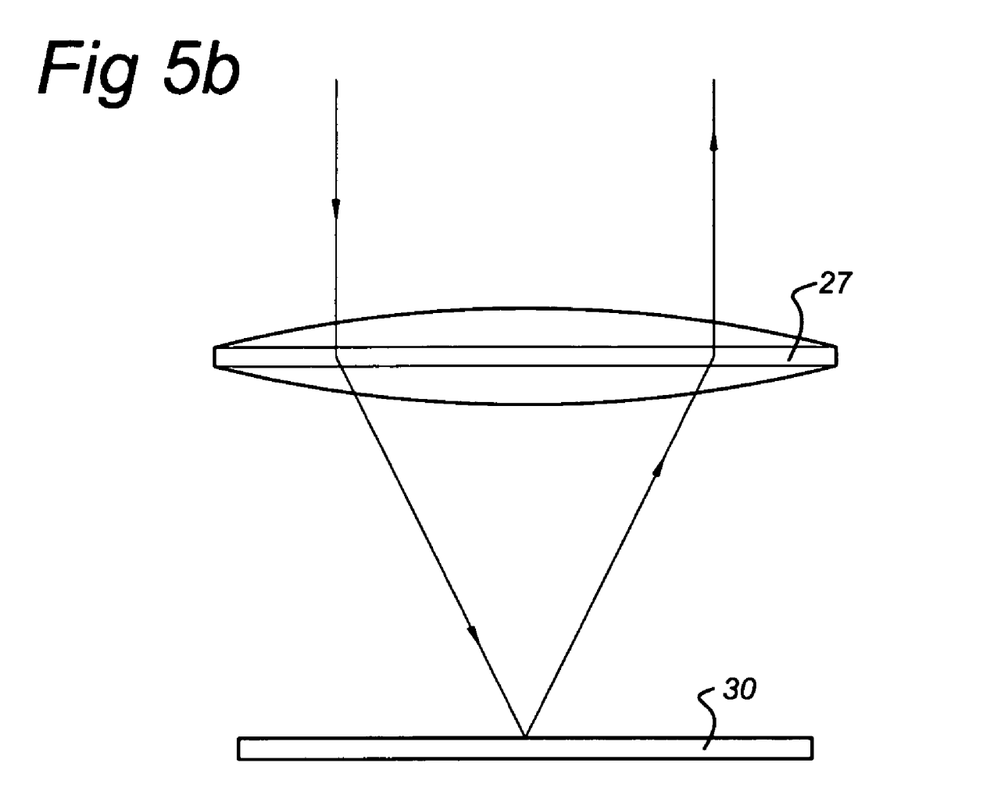

According to a further alternative embodiment, the beam modifying device BMD may be provided with a first and second positive lens 27, 28 to further increase the quality of the radiation beam as outputted by the beam modifying device BMD. The lenses 27, 28 are incorporated in the system to reduce the divergence of the radiation beam.

FIG. 5a schematically shows a perspective view of such an alternative. The first lens 27 is positioned in between the first and second splitter 10, 11 and a first mirror 30 and the second lens 28 is position in between the first and second splitter 10, 11 and a second mirror 31.

The focal distance of the first and second lenses 27, 28 are chosen such that a closed optical path is provided. By providing positive lenses in the delay paths, the divergence of the radiation beam can be reduced.

According to this embodiment, the lenses may be biconvex with radii R=985 mm, 10 mm thick and an index of refraction of 1.54. The distance between the lenses 27, 28 is 200 mm, the distance between the mirrors 30, 31 is 2000 mm. The lenses may be placed relatively close to the splitters 10, 11, so the power of the lenses is relatively low and the focal spot on the mirrors 30,31 is relatively large (1 mm diameter). By placing the lenses 27, 28 close to the mirrors 30, 31 (R=224 mm, 30 mm thick, distance between the lenses 27,28 is 1600 mm) the power of the lenses 27, 28 is higher and the focal spot on the mirrors is smaller (0.2 mm diameter).

Figure 6:
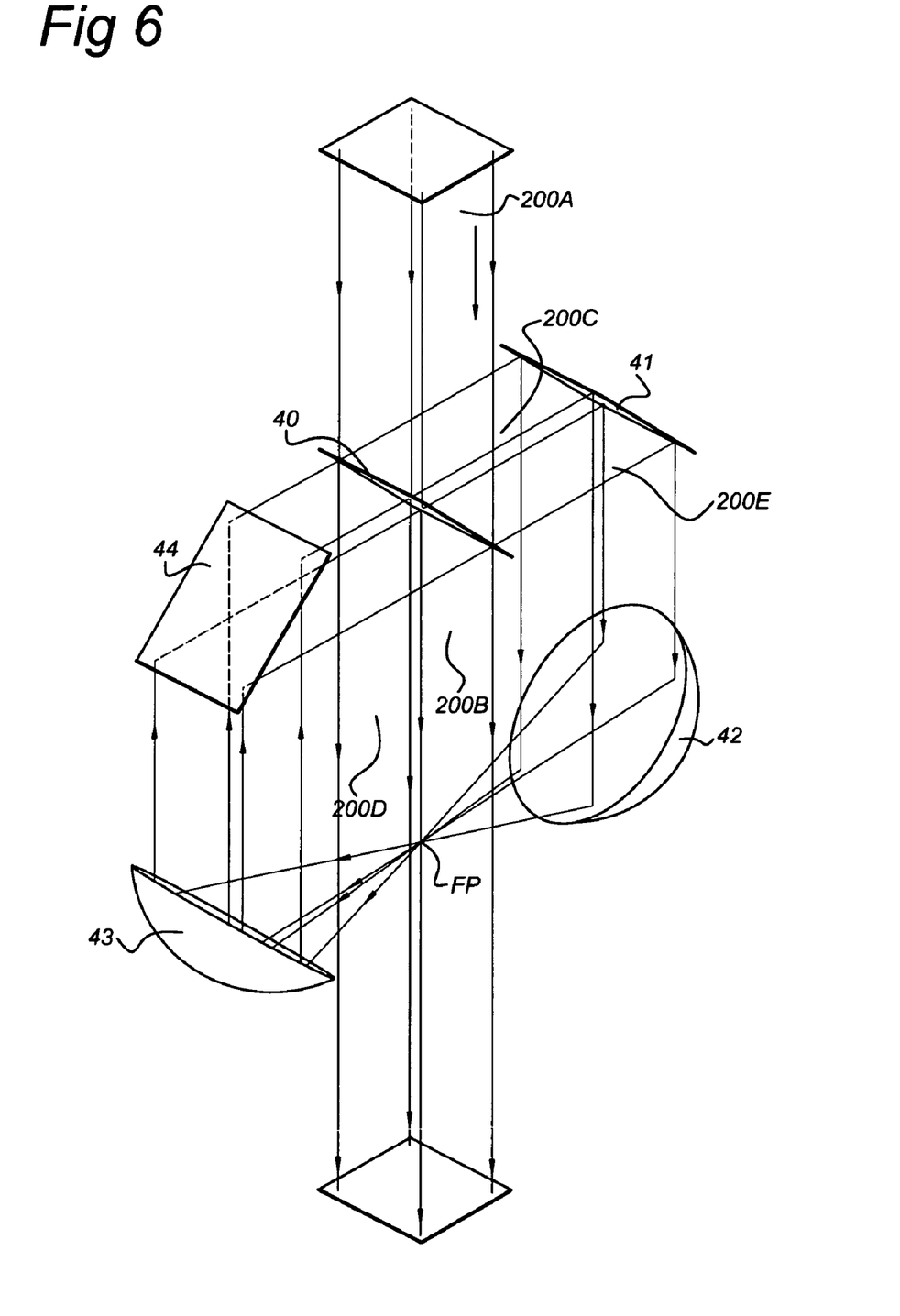
FIG. 6 schematically depicts a beam modifying device according to a second embodiment of the invention.

According to a further embodiment, an alternative beam modifying device BMD is provided, shown in FIG. 6. FIG. 6 schematically depicts a perspective view of the beam modifying device BMD'. The beam modifying device BMD' includes a splitter 40. The beam modifying device BMD' further includes a first mirror 41, a first and second concave mirror 42, 43 and a second mirror 44, all positioned in a rectangular configuration with respect to each other and forming a delay path, as can clearly be seen from FIG. 6. The first and second concave mirrors 42, 43 are identical.

An incoming radiation beam 200A hits the splitter 40 at an angle of 45°. The splitter separates the incoming radiation beam 200A in a part 200B and a part 200C. Part 200B passes the splitter 40 and exits the beam modifying device BMD', as is shown in FIG. 6. Part 200C is reflected by the splitter 40 to the first mirror 41. The first mirror 41 reflects part 200C to the first concave mirror 42. The first concave mirror 42 reflects part 200C and part 200C converges via a focal point FP towards the second concave mirror 43. The distance between the first concave mirror 42 and the second concave mirror 43 is twice the distance between the first concave mirror 42 and the focal point FP. From the focal point, part 200C is a divergent beam. Next, the second concave mirror 43 reflects the divergent beam into a collimated beam to the second mirror 44. Finally, the second mirror 44 reflects part 200C to the splitter 40.

Part 200C is then split by the splitter 40 to form a part 200D and a part 200E. Part 200D is reflected by the splitter to follow part 200B, while part 200E is transmitted by the splitter 40 to follow part 200C.

It will be understood that the embodiment explained above with reference to FIG. 6, is similar to the first embodiment discussed above, in that an incoming radiation beam is split in a different parts, where one part is directly outputted and the other part is guided into a delay path performing a mirroring operation of the incoming radiation beam.

However, the delay path according to FIG. 6 includes two concave mirrors 42, 43. As a result of this, part 200C is amplified with a factor of minus 1 (−1). In other words, part 200C is mirrored through a center of symmetry, the center of symmetry being in the center of the radiation beam as depicted in FIGS. 7a-d.

Figure 7A:
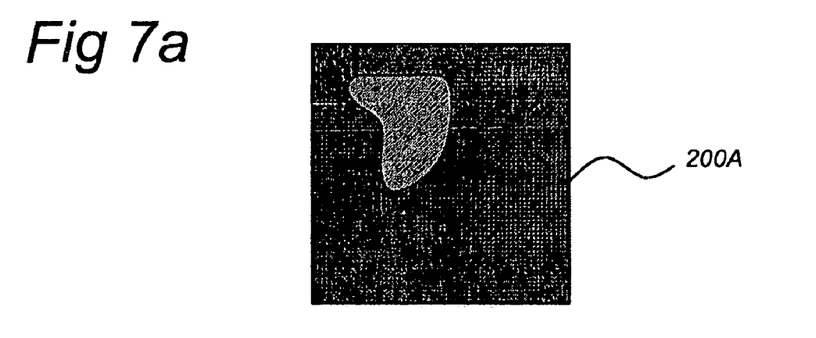
FIGS. 7a, 7b, 7c, 7d schematically depict intensity distributions of different radiation beams in the beam modifying device according to the second embodiment.
Figure 7B:
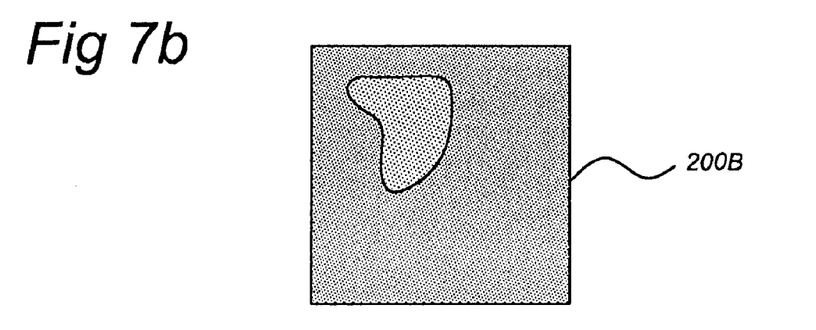
Figure 7C:
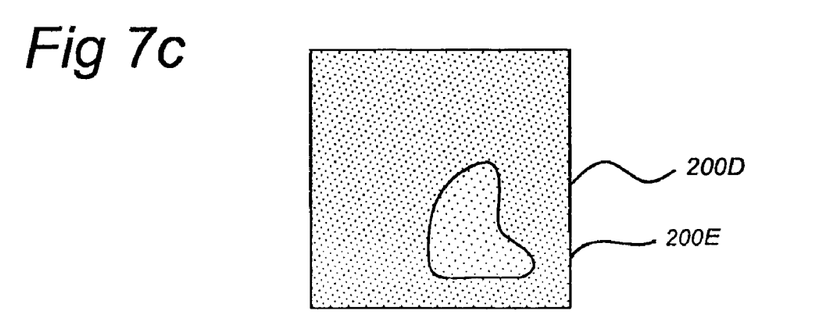

FIG. 7a shows a possible cross-sectional view of incoming radiation beam 200A. As an example, the incoming radiation beam 200A has an area with an increased intensity, indicated with the shaded part. FIG. 7b depicts a cross-sectional view of part 200B, after it is transmitted by the splitter 40. The intensity of this radiation is half the intensity of the incoming radiation beam 200A. Part 200C is similar to the part 200B. FIG. 7c shows the parts 200D and 200E. It is noted that the image shown in FIG. 7c is mirrored through a center of symmetry with respect to FIG. 7b and the intensity is halved.

Figure 7D:
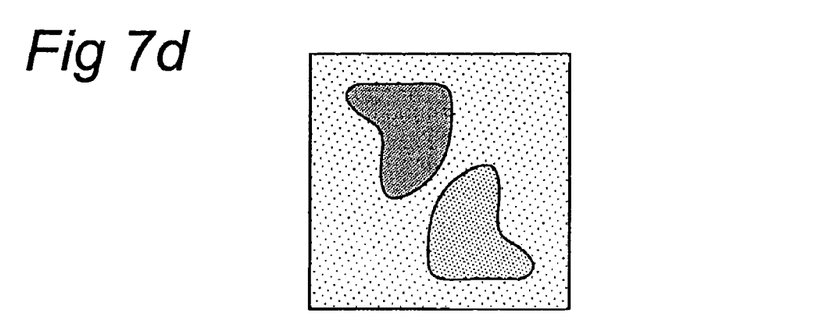

FIG. 7d finally shows the sum of all the subsequent pulses generated by the beam modifying device BMD'. It will be understood that a magnification of minus one (−1) also reduces asymmetrical characteristics of the incoming radiation beam 200A. According to the example discussed above with respect to FIGS. 7a-7d, an asymmetrical distribution of the intensity is reduced by mirroring part of the incoming radiation beam 200A through a center of symmetry. However, also irregularities in the shape of the contour of the radiation beam 200A and/or the divergence of the incoming radiation beam 200A are reduced.

The concave mirrors 42, 43 are positioned at a 45° angle with respect to the radiation beam hitting the concave mirrors 42, 43. As a result, the optical power of the concave mirrors 42, 43 is different along the x and the y-direction, where the x- and y-direction denote mutual substantially perpendicular directions, both being substantially perpendicular with respect to the direction of propagation of the radiation beam. This effect may be reduced by choosing a different power of the concave mirrors 42, 43, in the x and y direction.

Figure 8A:
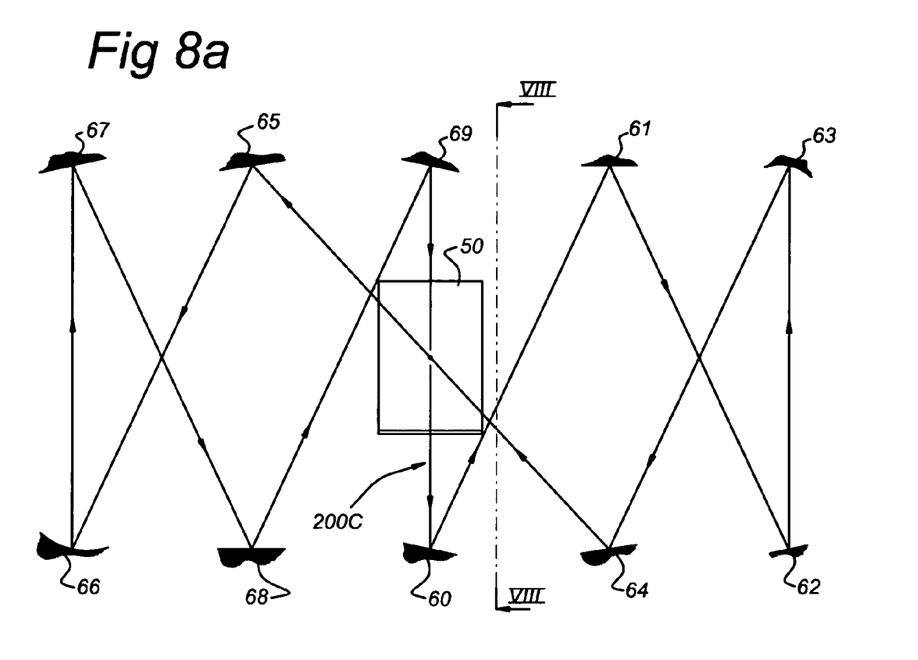
FIGS. 8a and 8b schematically depict a beam modifying device according to a variant to the second embodiment.
Figure 8B:
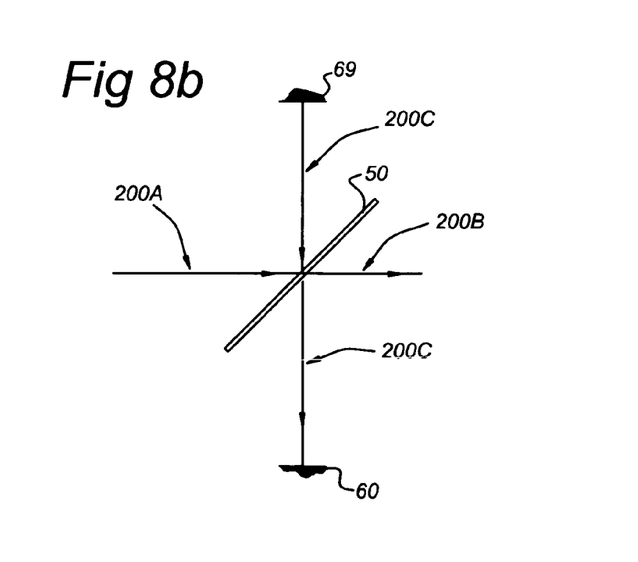

FIGS. 8a and 8b depict an alternative beam modifying device BMD". In FIG. 8a the incoming radiation beam 200A enters the beam modifying device BMD" perpendicular with respect to the drawing surface. Incoming radiation beam 200A hits a splitter 50 positioned at 45° with respect to the incoming radiation beam 200A. FIG. 8b, being a side view of the beam modifying device BMD" in a direction being substantially perpendicular with respect to the side view depicted in FIG. 8a (along line VIII), shows the incoming radiation beam 200A that hits the splitter 50 being positioned at 45" with respect to the incoming radiation beam 200A.

A part 200B, shown in FIG. 8b, of the incoming radiation beam is outputted by the beam modifying device BMD", while an other part 200C enters a delay path, formed by mirrors 60, 61, 62, 63, 64, 65, 66, 67, 68, 69. Mirrors 60, 61, 62, 64, 65, 67, 68, 69 are planar mirrors, while mirrors 63, 66 are concave mirrors. The effect of the concave mirrors 63, 66 is that part 200C is mirrored through a center of symmetry.

By way of example: the concave mirrors 63,66 may have a radius R=5.4 m, all other mirrors are flat. The beam is injected through splitter 50. The vertical height (e.g. from mirror 68 to mirror 65) is approximately 1.8 m, the horizontal spacing (e.g. from mirror 67 to 63) is approximately 0.19 m.

Since part 200C hits the mirrors 60, 61, 62, 63, 64, 65, 66, 67, 68, 69, and in particular the concave mirrors 63, 66 almost parallel with the normal of the mirror surface, the mirroring of part 200C does not negatively influence the symmetry of part 200C.

According to this alternative, more mirrors are provided, increasing the path length of the radiation beam.

It will be understood that the invention as described above is also applicable for continuous radiation beams, instead of pulsed radiation beams. In that case, the beam modifying device BMD according to the invention may also be used, to generate a more symmetrical radiation beam, and not to transform pulses in to a sequence of subsequent pulses.

According to an embodiment, a beam modifying device is configured to receive an input radiation beam along a first optical axis, and configured to emit an output radiation beam along a second optical axis. The beam modifying device includes a divider disposed along the first optical axis and configured to divide the incoming radiation beam into a first part and a second part, the divider being configured to direct the first part along the second optical axis and to direct the second part via a delay path. The beam modifying device further includes optics forming the delay path, the optics being configured to receive the second part and to direct the second part via the delay path and then along the second optical axis, wherein the optics are arranged to mirror the second part such that the second part is mirrored with respect to the first part. The first and second part may be in line with respect to each other.

Two different classes of beam modifying devices BMD are presented: a mirror-symmetric beam modifying devices BMD in which the intensity pattern is mirrored in one axis per roundtrip through the delay path (FIG. 5a) and a point symmetric beam modifying devices BMD in which the intensity pattern is mirrored in one point per roundtrip through the delay path (FIGS. 6 and 8). More mirrors and thus larger path lengths can be added to the shown configurations as long as the optical power (per roundtrip) is distributed in the roundtrip-path in such a way that the beam size remains constant, that no extra divergence is created per roundtrip (i.e. no aberrations beam modifying devices BMD is a region where the beam is collimated where the beam splitter(s) can be placed.

It will be understood that the beam modifying devices as presented here, may also be used as a beam stretching device. Such a beam stretching device can be used to receive a pulsed incoming beam, and turn each pulse into a plurality of pulses, each having a relatively low intensity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A beam modifying device configured to receive an input radiation beam along a first optical axis, and configured to emit an output radiation beam having a cross-section along a second optical axis, the beam modifying device comprising:

a divider disposed along the first optical axis and configured to divide the incoming radiation beam into a first part and a second part, the divider being configured to direct the first part along the second optical axis and to direct the second part via a delay path; and optics forming the delay path, the optics being configured to receive the second part and to direct the second part via the delay path and then along the second optical axis, wherein the optics are arranged to mirror the second part such that the second part is mirrored with respect to the first part about an axis of symmetry within the outer boundary of the cross-section of the output radiation beam, and wherein the divider comprises a first splitter and a second splitter, the first splitter arranged at a first angle to the first optical axis and the second splitter arranged at second angle to the first optical axis that is different from the first angle, the first splitter being configured to divide a portion of the incoming radiation beam into said first part and said second part, and the second splitter being configured to divide a remaining portion of the incoming radiation beam into a third part and a fourth part, the first splitter and the second splitter being configured to direct the first and third part along the second optical axis, said optics being arranged to form a first delay path and a second delay path, the first splitter being configured to direct the second part along the first delay path to the second splitter, and the second splitter being configured to direct the fourth part along the second delay path to the first splitter.

2. A beam modifying device according to claim 1, wherein the optics forming the delay path comprise a plurality of mirrors and a first and second concave mirror, together forming the delay path, where the first and second concave mirrors are configured to mirror the second part about the axis of symmetry and the axis of symmetry is through a center of the cross-section.

3. A beam modifying device according to claim 2, wherein a normal of the first and second concave mirrors are substantially parallel to the direction the second part is arranged to come from when the second part hits the first and second concave mirrors.

4. A beam modifying device according to claim 1, wherein the optics are arranged to mirror the second and fourth parts such that the second and fourth parts are mirrored with respect to the first and third parts.

5. A beam modifying device according to claim 1, further comprising a tilting device to rotate the beam modifying device about the first optical axis, or the second optical axis, or both the first and second optical axes.

6. A beam modifying device according to claim 1, wherein the optics forming the first delay path comprise a first mirror and a first positive lens and the optics forming the second delay path comprise a second mirror and a second positive lens.

7. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate;
a beam modifying device configured to receive the radiation beam along a first optical axis, and configured to emit an output radiation beam having a cross-section along a second optical axis, the beam modifying device comprising a divider disposed along the first optical axis and configured to divide the received radiation beam into a first part and a second part, the divider being configured to direct the first part along the second optical axis and to direct the second part via a delay path, and optics forming the delay path, the optics being configured to receive the second part and to direct the second part via the delay path and then along the second optical axis, wherein the optics are arranged to mirror the second part such that the second part is mirrored with respect to the first part about an axis of symmetry within the outer boundary of the cross-section of the output radiation beam, and
wherein the divider comprises a first splitter and a second splitter, the first splitter arranged at a first angle to the first optical axis and the second splitter arranged at second angle to the first optical axis that is different from the first angle, the first splitter being configured to divide a portion of the incoming radiation beam into said first part and said second part, and the second splitter being configured to divide a remaining portion of the incoming radiation beam into a third part and a fourth part, the first splitter and the second splitter being configured to direct the first and third part along the second optical axis, said optics being arranged to form a first delay path and a second delay path, the first splitter being configured to direct the second part along the first delay path to the second splitter, and the second splitter being configured to direct the fourth part along the second delay path to the first splitter.

8. A lithographic apparatus according to claim 7, further comprising a tilting device to rotate the beam modifying device about the first optical axis, or the second optical axis, or both the first and second optical axes.

9. A lithographic projection apparatus configured to project a pattern from a patterning device onto a substrate, wherein the lithographic apparatus comprises a beam modifying device configured to receive an input radiation beam along a first optical axis, and configured to emit an output radiation beam along a second optical axis, the beam modifying device comprising:
a divider comprising a first splitter arranged at a first angle to the first optical axis and a second splitter arranged at a second angle to the first optical axis that is different from the first angle, wherein the divider is disposed along the first optical axis such that a first portion of the input radiation beam becomes incident on the first splitter and a second portion of the input radiation beam becomes incident on the second splitter, and wherein (i) the first splitter is configured to divide the first portion of the input radiation beam into a first part and a second part, and to direct the first part along the second optical axis and direct the second part via a first delay path, and (ii) the second splitter is configured to divide the second portion of the input radiation beam into a first part and a second part, and to direct the first part along the second optical axis and direct the second part via a second delay path; and
optics forming the first and second delay paths, the optics being configured to receive the second parts of the first and second portions of the input radiation beam and to direct the second parts of the first and second portions of the input radiation beam via the first and second delay paths and then along the second optical axis, wherein the optics are arranged to mirror the second parts of the first and second portions of the input radiation beam such that the second parts of the first and second portions of the input radiation beam are mirrored with respect to the first parts of the first and second portions of the input radiation beam.

10. A lithographic apparatus according to claim 9, further comprising a tilting device to rotate the beam modifying device about the first optical axis, or the second optical axis, or both the first and second optical axes.

11. A beam modifying device configured to receive an input radiation beam along a first optical axis, and configured to emit an output radiation beam along a second optical axis, the beam modifying device comprising:
a divider comprising a first splitter arranged at a first angle to the first optical axis and a second splitter arranged at a second angle to the first optical axis that is different from the first angle, wherein the divider is disposed along the first optical axis such that a first portion of the input radiation beam becomes incident on the first splitter and a second portion of the input radiation beam becomes incident on the second splitter, and wherein (i) the first splitter is configured to divide the first portion of the input radiation beam into a first part and a second part, and to direct the first part along the second optical axis and direct the second part via a first delay path, and (ii) the second splitter is configured to divide the second portion of the input radiation beam into a first part and a second part, and to direct the first part along the second optical axis and direct the second part via a second delay path; and
optics forming the first and second delay paths, the optics being configured to receive the second parts of the first and second portions of the input radiation beam and to direct the second parts of the first and second portions of the input radiation beam via the first and second delay paths and then along the second optical axis, wherein the optics are arranged to mirror the second parts of the first and second portions of the input radiation beam such that the second parts of the first and second portions of the input radiation beam are mirrored with respect to the first parts of the first and second portions of the input radiation beam.

12. A beam modifying device according to claim 11, wherein the first splitter, the second splitter, or both the first and second splitters, is a semi-transparent mirror.

13. A beam modifying device according to claim 12, wherein the first angle or the second angle is 45°.

14. A beam modifying device according to claim 11, wherein the optics forming the first and second delay paths comprise a first and a second mirror, respectively.

15. A beam modifying device according to claim 14, wherein the first and second mirrors are each formed by a corner cube.

16. A beam modifying device according to claim 11, wherein the optics forming the first delay path comprise a first mirror and a first positive lens and the optics forming the second delay path comprise a second mirror and a second positive lens.

17. A beam modifying device according to claim 11, further comprising a tilting device to rotate the beam modifying device about the first optical axis, or the second optical axis, or both the first and second optical axes.

18. A beam modifying device according to claim 11, wherein the first angle is +45°, and wherein the second angle is −45°.

19. A beam modifying device according to claim 11, wherein the first portion of the input radiation beam comprises roughly half of the radiation in the input radiation beam.

20. A beam modifying device according to claim 11, wherein (i) the optics are configured to redirect the second part of the first portion of the incoming radiation beam via the first delay path to the second splitter and the second splitter is configured to divide the redirected second part of the first portion of the incoming radiation beam into a fifth and a sixth part, the second splitter being configured to direct the fifth part along the second optical axis and to direct the sixth part to continue via the second delay path, and (ii) the optics are configured to redirect the second part of the second portion of the incoming radiation beam via the second delay path to the first splitter and the first splitter is configured to divide the redirected second part of the second portion of the incoming radiation beam into a seventh and an eighth part, the first splitter being configured to direct the seventh part along the second optical axis and to direct the eighth part to continue via the first delay path.

21. A method of treating a beam of radiation, comprising:
receiving a radiation beam along a first optical axis as a first portion of the radiation beam and a second portion of the radiation beam that is separate from the first portion;
dividing each of the first portion and the second portion of the radiation beam into a first part and a second part;
directing the first parts of the first and second portions of the radiation beam along a second optical axis;
directing the second part of the first portion of the radiation beam via a first delay path and then along the second optical axis;
directing the second part of the second portion of the radiation beam via a second delay path and then along the second optical axis; and
mirroring the second parts of the first and second portions of the radiation beam such that the second parts of the first and second portions of the radiation beam are mirrored with respect to the first parts of the first and second portions of the radiation beam.

22. A method according to claim 21, wherein the first delay path comprises a first mirror and a first positive lens and the second delay path comprises a second mirror and a second positive lens.

23. A device manufacturing method, comprising:
providing a radiation beam having a cross-section;
patterning the radiation beam;
projecting the patterned radiation beam onto a substrate; and treating the radiation beam by;
receiving the radiation beam along a first optical axis,
dividing each of a first portion and a second portion, separate from the first portion, of the radiation beam into a first part and a second part,
directing the first parts of the first and second portions of the radiation beam along a second optical axis,
directing the second part of the first portion of the radiation beam via a first delay path and then along the second optical axis,
directing the second part of the second portion of the radiation beam via a second delay path and then along the second optical axis, and
mirroring the second parts of the first and second portions of the radiation beam such that the second parts of the first and second portions of the radiation beam are mirrored with respect to the first parts of the first and second portions of the radiation beam about an axis of symmetry within an outer boundary of the cross-section of the radiation beam.

24. A method according to claim 23, wherein the first and second delay paths comprise a plurality of mirrors and a first and second concave mirror, where the first and second concave mirrors mirror at least one of the second parts about the axis of symmetry and the axis of symmetry is through a center of the cross-section.

25. A method according to claim 24, wherein a normal of the first and second concave mirrors are substantially parallel to the direction the second part comes from when the second part hits the first and second concave mirrors.

* * * * *